United States Patent
Tong et al.

(10) Patent No.: US 12,057,158 B1
(45) Date of Patent: Aug. 6, 2024

(54) METHOD FOR OPERATING DYNAMIC MEMORY

(71) Applicant: HUAZHONG UNIVERSITY OF SCIENCE AND TECHNOLOGY, Hubei (CN)

(72) Inventors: Hao Tong, Hubei (CN); Binhao Wang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/021,177

(22) PCT Filed: Aug. 12, 2022

(86) PCT No.: PCT/CN2022/112132
§ 371 (c)(1),
(2) Date: Feb. 14, 2023

(87) PCT Pub. No.: WO2024/021177
PCT Pub. Date: Feb. 1, 2024

(30) Foreign Application Priority Data

Jul. 29, 2022 (CN) .......................... 202210909473.8

(51) Int. Cl.
*G11C 11/4093* (2006.01)
*G11C 11/406* (2006.01)
*G11C 11/4096* (2006.01)

(52) U.S. Cl.
CPC .... *G11C 11/4096* (2013.01); *G11C 11/40603* (2013.01); *G11C 11/4093* (2013.01); *G11C 2211/4068* (2013.01)

(58) Field of Classification Search
CPC ............ G11C 11/40603; G11C 11/406; G11C 2211/406
(Continued)

(56) References Cited

U.S. PATENT DOCUMENTS 6,490,216 B1 * 12/2002 Chen .................... G11C 11/4085
365/228
2016/0070329 A1 * 3/2016 Aochi ...................... G06F 1/263
714/42

(Continued)

FOREIGN PATENT DOCUMENTS

CN  109542839  3/2019
CN  113990368  1/2022

(Continued)

OTHER PUBLICATIONS

"International Search Report (Form PCT/ISA/210) of PCT/CN2022/112132", mailed on Nov. 30, 2022, pp. 1-5.

(Continued)

*Primary Examiner* — Anthan Tran
(74) *Attorney, Agent, or Firm* — JCIPRNET

(57) ABSTRACT

A method for operating a dynamic memory is provided, and the method includes the following steps. A refresh operation is performed on the dynamic memory according to predetermined interval time T, an operation command is received in real time at the same time, a read operation is performed on a selected memory cell according to position information of the selected memory cell in the operation command when the operation command is received, and state data read in the read operation is temporarily stored in a read buffer. The interval time T is less than time t required for a voltage value of a capacitor in the memory cell to drop to a critical capacitor voltage value for the read operation to correctly read the state data of the memory cell during a write operation. According to operation command type informa-
(Continued)

tion in the operation command, corresponding operations are performed on the selected memory cell.

7 Claims, 8 Drawing Sheets

(58) Field of Classification Search
USPC .......................................................... 365/149
See application file for complete search history.

(56) References Cited

U.S. PATENT DOCUMENTS

2017/0053698 A1     2/2017  Ly-Gagnon et al.
2021/0027828 A1*    1/2021  Yamazaki ........... H01L 27/1251

FOREIGN PATENT DOCUMENTS

| CN | 114360596 | 4/2022 |
| CN | 114709211 | 7/2022 |

OTHER PUBLICATIONS

"Written Opinion of the International Searching Authority (Form PCT/ISA/237) of PCT/CN2022/112132", mailed on Nov. 30, 2022, pp. 1-4.

* cited by examiner

METHOD FOR OPERATING DYNAMIC MEMORY

CROSS-REFERENCE TO RELATED APPLICATION

This application is a 371 of international application of PCT application serial no. PCT/CN2022/112132, filed on Aug. 12, 2022, which claims the priority benefit of China application no. 202210909473.8, filed on Jul. 29, 2022. The entirety of each of the above mentioned patent applications is hereby incorporated by reference herein and made a part of this specification.

BACKGROUND

Technical Field

The disclosure belongs to the technical field of memory, and in particular, relates to a method for operating a dynamic memory.

Description of Related Art

In the computer structure of the Von Neumann Architecture, DRAM (Dynamic Random Access Memory) plays a role in the connection between the external memory and the CPU and thus is crucial to the stability of the computer system. DRAM adopts a 1T1C structure, that is, it consists of 1 transistor and 1 memory cell connected in series. A transistor is a three-port device, and its peripheral control circuit needs to consume a large area. Further, three-port devices are not suitable for three-dimensional stacking. This makes it difficult for DRAM to achieve high-density storage through three-dimensional integration, which is currently the most critical factor restricting DRAM performance.

At present, in order to solve the problem of low storage density of DRAM, the academia and industry in the field of memory have explored many new types of memory that can be used to replace DRAM. Among them, in the Chinese invention patent CN202111280349.1, it is disclosed that an OTS gate transistor and a capacitor are connected in series to form a memory cell (1S1C unit). This unit is comparable to DRAM in terms of read and write speed and power consumption and is a new type of storage technology that is very promising to replace DRAM. However, no research has yet be provided to elaborate on the read and write solutions of its arrays in detail. Further, this type of memory is a dynamic memory, and the charge stored in the capacitor will be gradually lost due to the leakage effect, and the read and write operations of this memory cell is going to be affected.

SUMMARY

In response to the above defects of the related art, the disclosure aims to provide a method for operating a dynamic memory capable of effectively ensuring the normal operation of read and write operations performed on a selected memory cell even if leakage occurs in a capacitor in this memory cell.

To achieve the above, the disclosure provides a method for operating a dynamic memory. The dynamic memory includes wordlines and bitlines arranged vertically to each other and memory cells arranged in an array between the wordlines and the bitlines. Each memory cell includes a capacitor and a two-terminal gate device connected in series. The two-terminal gate device has bidirectional conduction characteristics and has a conduction threshold voltage $V_{TH}$ and a holding voltage $V_{hold}$. The method includes the following steps:

(1) A refresh operation is performed on the dynamic memory according to predetermined interval time T, an operation command is received in real time at the same time, a read operation is performed on a selected memory cell according to position information of the selected memory cell in the operation command when the operation command is received, and state data read in the read operation is temporarily stored. Herein, the interval time T is less than time t required for a voltage value of the capacitor in the memory cell to drop to a critical capacitor voltage value for the read operation to correctly read the state data of the memory cell during a write operation.

(2) A corresponding operation is performed on the selected memory cell according to operation command type information in the operation command, and the temporarily stored data is outputted to a corresponding I/O port if a received operation command type is a read operation and step (3) is then performed, step (3) is performed if the received operation command type is a refresh operation, or step (4) is performed if the received operation command type is a write operation.

(3) A write state 1 operation is performed on the selected memory cell, the temporarily stored data of the selected memory cell is determined next, and the operation is ended if the temporarily stored data is in state 1, or a write state 0 operation is performed on the selected memory cell if the temporarily stored data is in state 0.

(4) Operation information of the write operation is obtained, and according to the obtained operation information of the write operation, the write state 1 operation or the write state 0 operation is correspondingly performed on the selected memory cell.

In the method for operating the dynamic memory provided by the disclosure, it is set to perform a refresh operation on the selected memory cell according to the interval time T. Further, the interval time T is less than the time t required for the voltage value of the capacitor in the memory cell to drop to the critical capacitor voltage value for the read operation to correctly read the state data of the memory cell during the write operation. In this way, even if leakage occurs in the capacitor in the memory cell, it can effectively ensure that the read operation can always correctly read the state data of the memory cell. In addition, when an operation command is received, it is set to immediately perform a read operation on the selected memory cell and temporarily store the state data. Further, a refresh operation execution step (rewriting the temporarily stored data to the memory cell) is performed after each read operation. In this way, it can effectively ensure that the state data of the memory cell is correctly written in the subsequent write operation.

In an embodiment, in step (1), the step of performing the read operation on the selected memory cell and temporarily storing the state data read in the read operation specifically includes the following steps.

(a) A bitline voltage $V_{BLread}$ is applied on the bitline connected to the selected memory cell and a wordline voltage $V_{Wlread}$ is applied on the wordline connected to the selected memory cell to generate a read voltage of $V_{read}$ at both ends of the memory cell to be read. The read voltage $V_{read}$ is configured to keep the two-terminal gate device in the selected memory cell in state 0 to be turned off and to turn on the two-terminal gate device in the selected memory cell in state 1 to change the selected memory cell from state 1 to state 0, and generates a read current.

(b) It is detected whether a read current is provided on the bitline connected to the selected memory cell, and it is determined that the selected memory cell is in state 1 if a read current is provided and a state 1 signal is outputted, otherwise it is determined that the selected memory cell is in state 0 if a read current is not provided and a state 0 signal is outputted.

(c) The outputted state signal is sent to a read buffer for temporary data storage.

In an embodiment, in step (a), the read voltage $V_{read}$ satisfies the following relationships: $V_{read} - V_{C1} > V_{TH}$ and $V_{read} - V_{C0} < V_{TH}$, where $V_{C1}$ is the capacitor voltage when the memory cell is in state 1, and $V_{C0}$ is the capacitor voltage when the memory cell is in state 0.

In an embodiment, performing the write state 1 operation on the selected memory cell is implemented by applying a voltage $V_{WL1}$ on the wordline connected to the selected memory cell and applying a voltage $V_{BL1}$ on the bitline connected to the selected memory cell to form a voltage difference of $V_{IN1}$ at both ends of the selected memory cell. Performing the write state 0 operation on the selected memory cell is implemented by applying a voltage $V_{WL0}$ on the wordline connected to the selected memory cell and applying a voltage $V_{BL0}$ on the bitline connected to the selected memory cell to form a voltage difference of $V_{IN0}$ at both ends of the selected memory cell.

The voltage difference $V_{IN1}$ and the voltage difference $V_{IN0}$ satisfy the following relationships:

$$V_{IN1} = V_{BL1} - V_{WL1}, V_{IN0} = V_{BL0} - V_{WL0}$$

$$|V_{IN1}| = |V_{IN0}|$$

$$V_{TH} < |V_{IN1}| = |V_{IN0}| < V_{TH} + V_{Hold}$$

$$|V_{IN1}| - V_{Hold} + |V_{BL1}| < V_{TH}$$

$$|V_{IN1}| - V_{Hold} + |V_{WL1}| < V_{TH}$$

$$|V_{IN1}| - V_{Hold} + |V_{BL0}| < V_{TH}$$

$$|V_{IN1}| - V_{Hold} + |V_{WL0}| < V_{TH}$$

$$|V_{IN1}| - V_{Hold} + |V_{BLread}| < V_{TH}$$

$$|V_{IN1}| - V_{Hold} + |V_{WLread}| < V_{TH}.$$

In an embodiment, the interval time T is less than the time t required for the capacitor voltage in the memory cell to drop from $||V_{IN}| - V_{Hold}|$ to $V_{read} - V_{TH}$, and $|V_{IN}| = |V_{IN1}| = |V_{IN0}|$.

In an embodiment, step (4) specifically includes the following steps.

When the operation information of the write operation is the write state 1, the write state 1 operation is directly performed on the selected memory cell. When the operation information of the write operation is the write state 0, the write state 1 operation is performed on the selected memory cell first, and the write state 0 operation is performed on the selected memory cell next.

In an embodiment, the position information of the selected memory cell in the operation command includes bitwise, entire row, entire column, or matrix position information.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure.

In order to ensure that the capacitor leakage in a memory cell does not affect the read and write operations of the memory cell, the disclosure provides a method for operating a dynamic memory. The applicable dynamic memory includes wordlines and bitlines arranged vertically to each other and memory cells arranged in an array between the wordlines and the bitlines. Herein, each memory cell includes a capacitor and a two-terminal gate device connected in series. The two-terminal gate device has bidirectional conduction characteristics and has a conduction threshold voltage $V_{TH}$ and a holding voltage $V_{hold}$.

Figure 1:
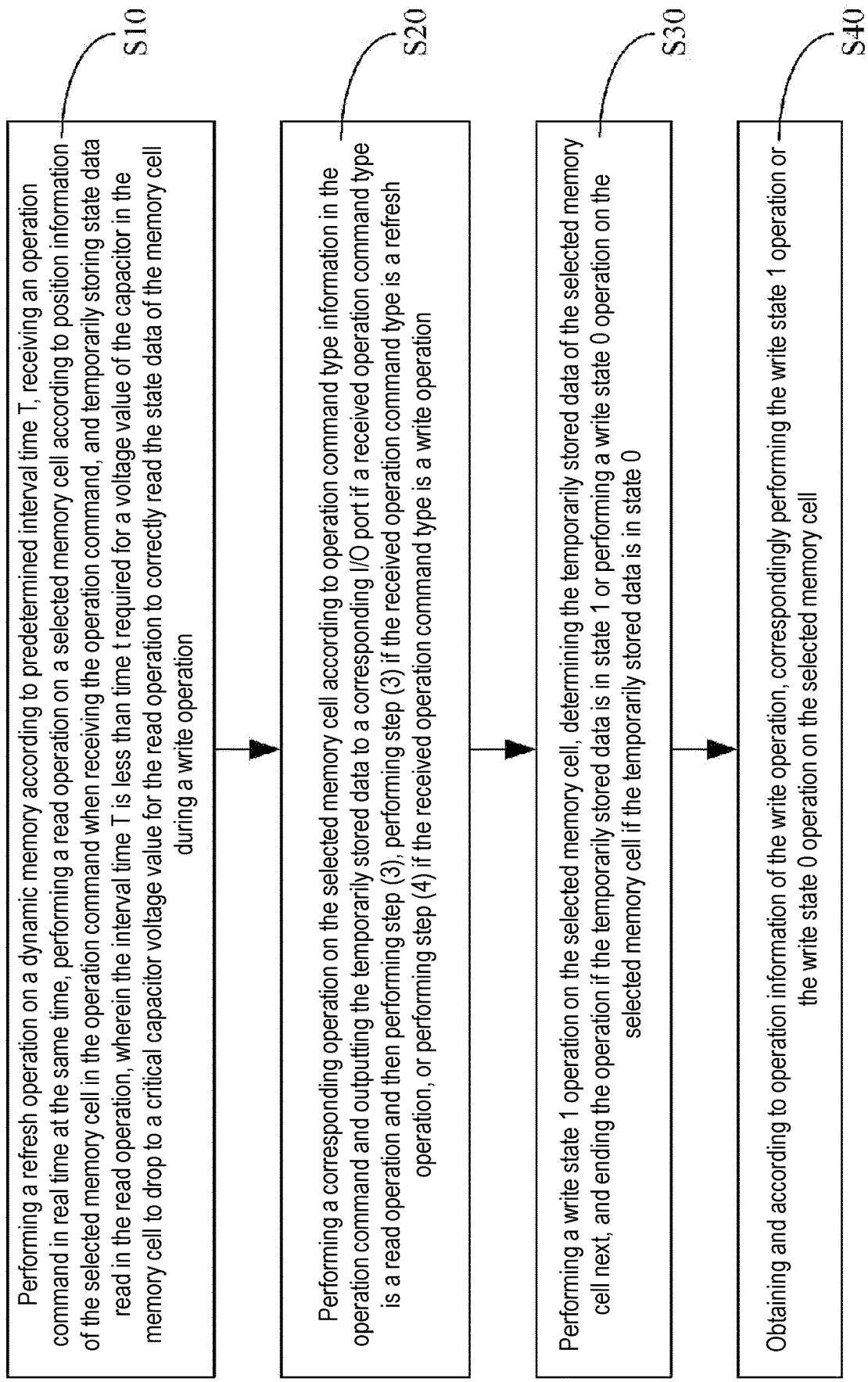
FIG. 1 is a schematic flow chart of a method for operating a dynamic memory provided by an embodiment of the disclosure.

FIG. 1 is a flow chart of a method for operating a dynamic memory provided by an embodiment of the disclosure. As shown in FIG. 1, the method includes the following steps S10 to S40, and the steps are described in detail as follows.

In step S10, a refresh operation is performed on the dynamic memory according to predetermined interval time T, an operation command is received in real time at the same time, a read operation is performed on a selected memory cell according to position information of the selected memory cell in the operation command when the operation command is received, and state data which is read is temporarily stored. Specifically, it may be temporarily stored in a read buffer.

In step S10, the interval time T is less than time t required for a voltage value of a capacitor in the memory cell to drop to a critical capacitor voltage value for the read operation to correctly read the state data of the memory cell during a write operation. Since the voltage of the capacitor in the memory cell may gradually drop due to the leakage effect, when the voltage value of the capacitor drops to the critical capacitor voltage value for correctly reading the state data at this time during the read operation, read and write errors may occur in the subsequent read operation. For instance, when the current write state of the memory cell is 1 and the voltage value of the capacitor in the memory cell at this time is $V_1$, if leakage occurs in the capacitor in the memory cell at this time, the voltage of the capacitor may gradually drop from $V_1$. When the read operation correctly reads state 1, the voltage of the capacitor must be between $V_2$ to $V_3$ ($V_3$ is greater than $V_2$). As such, the memory cell needs to be refreshed before the capacitor voltage drops from $V_1$ to $V_2$ to ensure that the subsequent read operation reads state data errors. In the same way, the situation when the memory cell is in write state 0 may be known, and description thereof is not provided in this embodiment.

The operation command provided in this embodiment includes the position information of the selected memory cell and an operation command type, and the operation command type includes a read operation, a write operation, and a refresh operation. The position information of the selected memory cell includes bitwise, entire row, entire column, or matrix position information. That is, the position information of the wordline and the bitline where the selected memory cell is located is configured to perform read and write operations on the memory cells in the dynamic memory correspondingly bitwise, by entire row, by entire column, and by matrix. For instance, when it is necessary to perform bitwise read and write operations on memory cells in the dynamic memory, it is only necessary to obtain information about the memory cells to be operated, that is, the information of the wordlines and bitlines where the memory cells are located. Based on this information, corresponding operations may then be performed according to the operation method provided by this embodiment. When it is necessary to perform read and write operations on the entire row of memory cells in the dynamic memory, only the wordline and bitline information of the row of memory cells is required. Based on this information, corresponding operations may then be performed according to the operation method provided by this embodiment. In the same way, it can be known how to implement the read and write operations of the entire column and matrix, and description thereof is not provided in this embodiment.

In this embodiment, the dynamic memory will only work after receiving an operation command. Further, after receiving the operation command, the dynamic memory may immediately read the selected memory cell and sends the current state data of the selected memory cell to the read buffer for temporary storage, so as to correctly perform a write operation on the memory cell through the state data temporarily stored in the read buffer during the subsequent write operation. After the data is temporarily stored, the next operation is performed according to the operation command type the operation command, such as the following step S20.

In S20, a corresponding operation is performed on the selected memory cell according to the operation command type information in the operation command, and the temporarily stored data in the read buffer is outputted to a corresponding I/O port if the received operation command type is a read operation and step S30 is then performed, step S30 is performed if the received operation command type is a refresh operation, or step S40 is performed if the received operation command type is a write operation.

In S30, a write state 1 operation is performed on the selected memory cell, the temporarily stored data of the selected memory cell in the read buffer is determined next, and the operation is ended if the temporarily stored data is in state 1, or a write state 0 operation is performed on the selected memory cell if the temporarily stored data is in state 0.

In steps S20 and S30, after each read operation, a refresh operation execution step is performed. This is because the refresh operation execution step is to rewrite the data of the selected memory cell temporarily stored in the read buffer, so as to facilitate the correct write operation of the memory cell through the state data temporarily stored in the read buffer during the subsequent write operation.

In S40, operation information of the write operation is obtained, and according to the operation information of the write operation, the write state 1 operation or the write state 0 operation is correspondingly performed on the selected memory cell. Herein, the operation information of the write operation includes the write state 1 operation and the write state 0 operation. When the operation information of the write operation is the write state 1, the write state 1 operation may be directly performed on the selected memory cell. When the operation information of the write operation is the write state 0, the write state 1 operation is performed on the selected memory cell first and the write state 0 operation is performed on the selected memory cell next.

In the method for operating the dynamic memory provided by this embodiment, it is set to perform an interval refresh operation on the selected memory cell according to the time T. Further, the interval time T is less than the time t required for the voltage value of the capacitor in the memory cell to drop to the critical capacitor voltage value for the read operation to correctly read the state data of the memory cell during the write operation. In this way, even if leakage occurs in the capacitor in the memory cell, it can effectively ensure that the read operation can always correctly read the state data of the memory cell. In addition, when an operation command is received, it is set to immediately perform a read operation on the selected memory cell and temporarily store the state data. Further, a refresh operation execution step (rewriting the temporarily stored data to the memory cell) is performed after each read operation. In this way, it can effectively ensure that the state data of the memory cell is correctly written in the subsequent write operation.

In an embodiment, the implementation of the read operation provided in this embodiment can be accomplished by applying specific voltages on the wordline and the bitline connected to the selected memory cell, and the specific steps are provided as follows:

In step 1, a bitline voltage $V_{BLread}$ is applied on the bitline connected to the selected memory cell and a wordline voltage $V_{Wlread}$ is applied on the wordline connected to the selected memory cell to generate a read voltage of $V_{read}$ at both ends of the memory cell to be read. The read voltage $V_{read}$ is configured to keep the two-terminal gate device in the selected memory cell in state 0 to be turned off and to turn on the two-terminal gate device in the selected memory cell in state 1 to change the selected memory cell from state 1 to state 0, and generates a read current. That is, the read voltage $V_{read}$ satisfies the following relationships: $V_{read} - V_{C1} > V_{TH}$ and $V_{read} - V_{C0} < V_{TH}$, where $V_{C1}$ is the capacitor voltage when the memory cell is in state 1, and $V_{C0}$ is the capacitor voltage when the memory cell is in state 0.

In step 2, it is detected whether a read current is provided on the bitline connected to the selected memory cell, and it is determined that the selected memory cell is in state 1 if a read current is provided and a state 1 signal is outputted, otherwise it is determined that the selected memory cell is in state 0 if a read current is not provided and a state 0 signal is outputted. After the read operation, the selected memory cells are all in state 0, and then proceed to the next step according to the received operation command type, such as the above step S20.

In step 3, the outputted state signal is sent to a read buffer for temporary data storage.

In an embodiment, performing the write state 1 operation on the selected memory cell may be implemented by applying a voltage $V_{WL1}$ on the wordline connected to the selected memory cell and applying a voltage $V_{BL1}$ on the bitline connected to the selected memory cell to form a voltage difference of $V_{IN1}=V_{BL1}-V_{WL1}$ at both ends of the selected memory cell.

Performing the write state 0 operation on the selected memory cell may be implemented by applying a voltage $V_{WL0}$ on the wordline connected to the selected memory cell and applying a voltage $V_{BL0}$ on the bitline connected to the selected memory cell to form a voltage difference of $V_{IN0}=V_{BL0}-V_{WL0}$ at both ends of the selected memory cell.

Herein, $V_{IN1}$ and $V_{IN0}$ are two voltage pulses with the same amplitude and opposite polarities, namely $|V_{IN1}|=|V_{IN0}|$. In order to write data normally, it is necessary to satisfy the relationship: $V_{TH}<|V_{IN1}|=|V_{IN0}|<V_{TH}+V_{Hold}$. The principle is provided as follows. When an operating voltage pulse VII with an amplitude between $V_{TH}$ and $V_{TH}+V_{Hold}$ is applied to both ends of the memory cell, the initial impedance state of the gate transistor is a high-impedance state, the voltage on the capacitor is 0V, the applied voltage pulse $V_{IN1}$ is completely added to the gate transistor, and its amplitude is greater than $V_{TH}$. In this way, the gate transistor is switched from a high-impedance state to a low-impedance state, the capacitor is quickly charged, and as the capacitor voltage rises, the voltage at both ends of the gate transistor drops. When the voltage across the gate transistor drops below $V_{Hold}$, the gate transistor is switched from a low-impedance state to a high-impedance state, and the capacitor voltage is maintained at $V_{IN1}-V_{Hold}$ at this time. After the operating voltage $V_{IN1}$ is applied, the capacitor voltage $V_{IN1}-V_{Hold}$ is less than $V_{TH}$, the gate transistor remains in a high-impedance state, the capacitor voltage remains at $V_{IN1}-V_{Hold}$, and the writing of the logic state "1" is completed. For the writing principle of the logic state 0, reference may be made to the abovementioned writing principle of the logic state "1", which is not going to be described in detail in this embodiment. The difference between the two is that the operating voltage pulses $V_{IN0}$ and $V_{IN1}$ have the same amplitude and opposite polarities, and the capacitor voltage has the same amplitude and opposite polarity as the capacitor voltage in the logic state "0", which is $-||V_{IN0}|-V_{Hold}|$.

According to the principle of writing state 1 and writing state 0 of the memory cell provided in this embodiment, it can be known that no matter whether it is writing state 1 or writing state 0, the voltage value across the capacitor in the memory cell at this time is $||V_{IN}|-V_{Hold}|$ and $|V_{IN}|=|V_{IN1}|=|V_{IN0}|$. Therefore, in this write operation mode, the interval time T of the refresh operation provided by the disclosure shall be less than the time t required for the capacitor voltage in the memory cell to drop from $||V_{IN}|-V_{Hold}|$ to $V_{read}-V_{TH}$.

At the same time, in order to ensure that the voltage applied on the wordline and bitline may not affect the storage state of a half-selected cell (a memory cell that shares the same wordline or bitline as the selected memory cell) and a unselected memory cell (a memory cells that share neither a wordline nor a bitline with the selected memory cell) when the read and write operations are performed on the selected memory cell, $V_{BL1}$, $V_{WL1}$, $V_{BL0}$, and $V_{WL0}$ need to satisfy the following relationships:

$$||V_{IN1}|-V_{Hold}+|V_{BL1}|<V_{TH}$$

$$||V_{IN1}|-V_{Hold}+|V_{WL1}|<V_{TH}$$

$$||V_{IN1}|-V_{Hold}+|V_{BL0}|<V_{TH}$$

$$||V_{IN1}|-V_{Hold}+|V_{WL0}|<V_{TH}$$

$$||V_{IN1}|-V_{Hold}+|V_{BLread}|<V_{TH}$$

$$||V_{IN1}|-V_{Hold}+|V_{WLread}|<V_{TH}.$$

Herein, $V_{TH}$ represents the conduction threshold voltage of a two-terminal gate transistor device of the dynamic memory, $V_{Hold}$ represents the holding voltage of the two-terminal gate transistor device in the dynamic memory, $V_{BL1}$ represents the voltage applied to the bitline connected to the selected memory cell when being in writing state 1, $V_{WL1}$ represents the voltage applied on the wordline connected to the selected memory cell when being in writing state 1, $V_{BL0}$ represents the voltage applied on the bitline connected to the selected memory cell when being in writing state 0, $V_{WL0}$ represents the voltage applied on the wordline connected to the selected memory cell when being in writing state 0, $V_{BLread}$ represents the voltage applied on the bitline connected to the selected memory cell during the read operation, $V_{Wlread}$ represents the voltage applied on the wordline connected to the selected memory cell during the read operation, the capacitor voltage fluctuation range in the selected memory cell in state 1 is: $-||V_{IN1}-V_{Hold}|$ to $V_{read}-V_{TH}$, and the capacitor voltage of the capacitor voltage in the selected memory cell in state 0 is: $V_{read}-V_{TH}$ to $||V_{IN1}-V_{Hold}|$.

$|V_{IN1}-V_{Hold}|$ is the capacitor voltage amplitude after the state writing is completed. Because there is leakage in the capacitor, the capacitor voltage after the state writing is completed may gradually decrease over time, so the maximum voltage across the capacitor is $|V_{IN1}-V_{Hold}|$. Therefore, it is only necessary to ensure that the half-selected cell whose capacitor voltage is $|V_{IN1}-V_{Hold}|$ is not affected when the memory cell is read and written. That is, the voltage across the gate transistor corresponding to the half-selected cell is always less than the threshold voltage $V_{TH}$, that is, $V_{BL1}$, $V_{WL1}$, $V_{BL0}$, $V_{WL0}$, $V_{BLread}$, $V_{Wlread}$ plus $|V_{IN1}-V_{Hold}|$ is less than $V_{TH}$.

In order to illustrate the disclosure more clearly, the disclosure is described below in together with specific embodiments.

A 1S1C memory is provided, where the selected threshold voltage Vth of the gate transistor is 4V, and the holding voltage $V_{hold}$ is 3V.

$$V_{IN1}=-4.5V, V_{BL1}=-2.5V, V_{WL1}=2V$$

$$V_{IN0}=4.5V, V_{BL0}=2.5V, V_{WL0}=-2V$$

$$V_{read}=4.5V, V_{BLread}=2.5V, V_{WLread}=-2V$$

The capacitor voltage in state 1 is: −1.5V to 0.5V, and the capacitor voltage in state 0 is: 0.5V to 1.5V.

Figure 2:
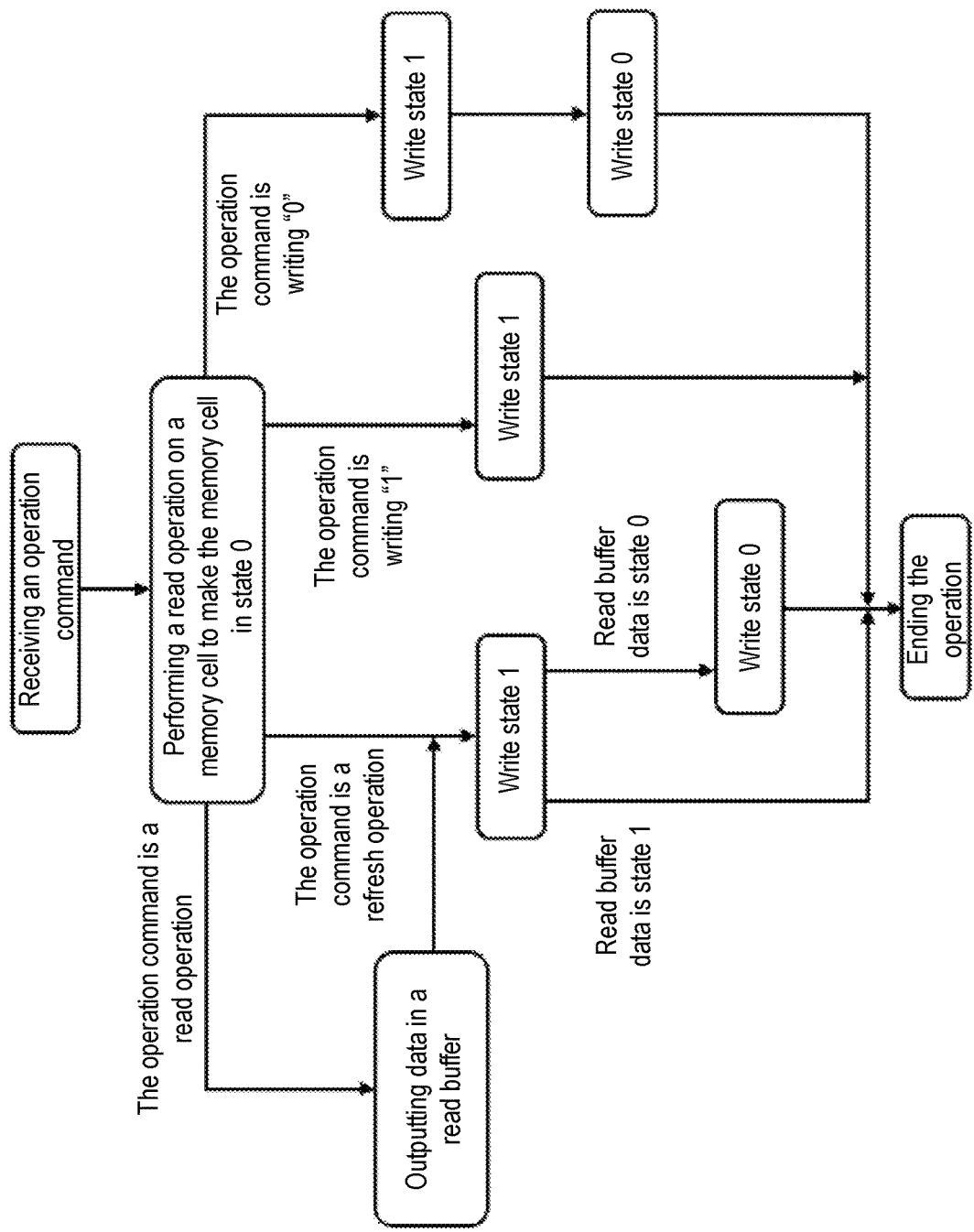
FIG. 2 and FIG. 3 correspond to functional block diagrams of a method for a dynamic memory bitwise operation and a method for a dynamic memory entire row operation provided by an embodiment of the disclosure.

As shown in FIG. 2, a method for a dynamic memory bitwise operation is provided.

Figure 4:
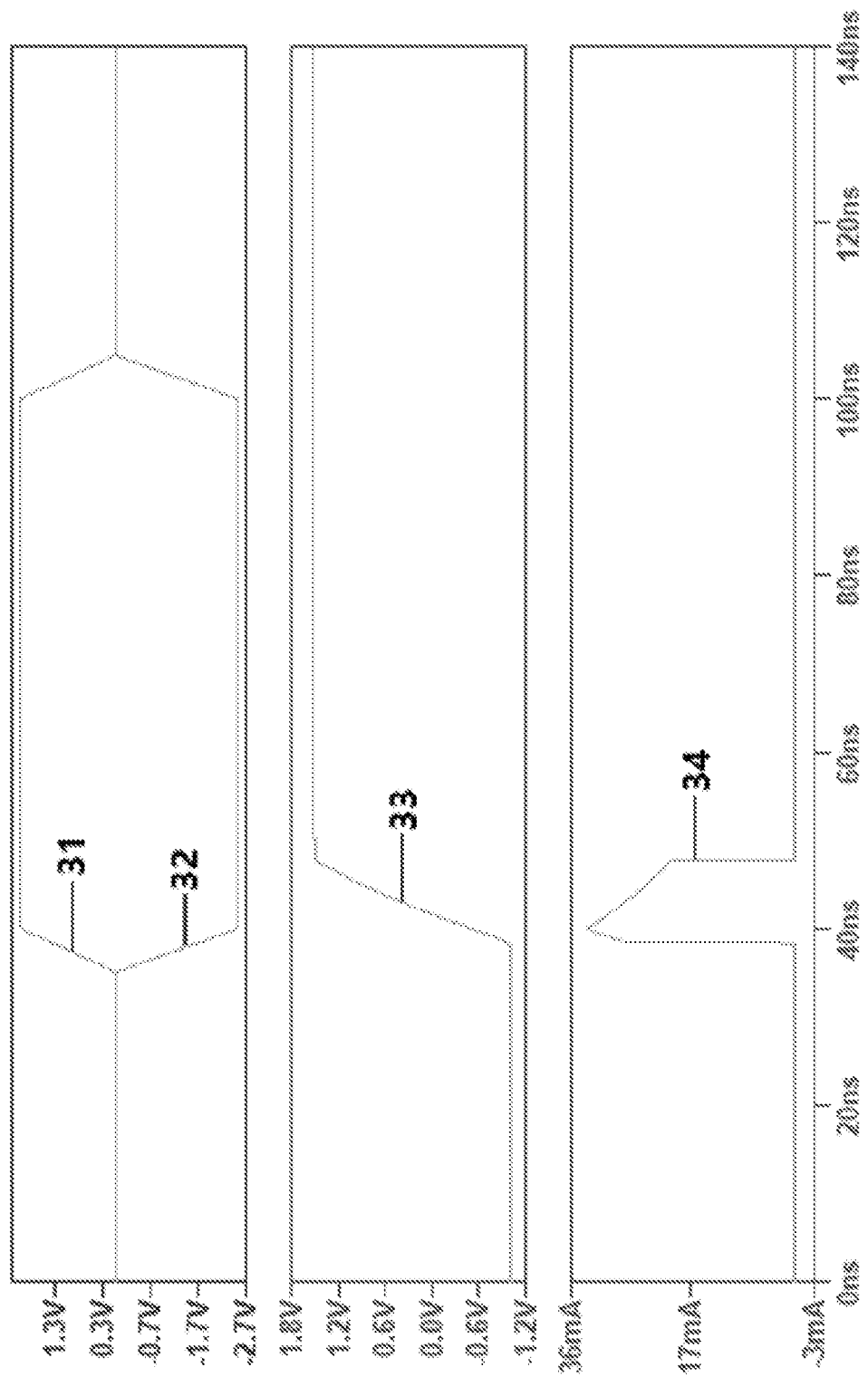
FIG. 4 and FIG. 5 correspond to graphs of applying a 4.5V read voltage to selected memory cells in state 1 and state 0 provided by an embodiment of the disclosure.
Figure 5:
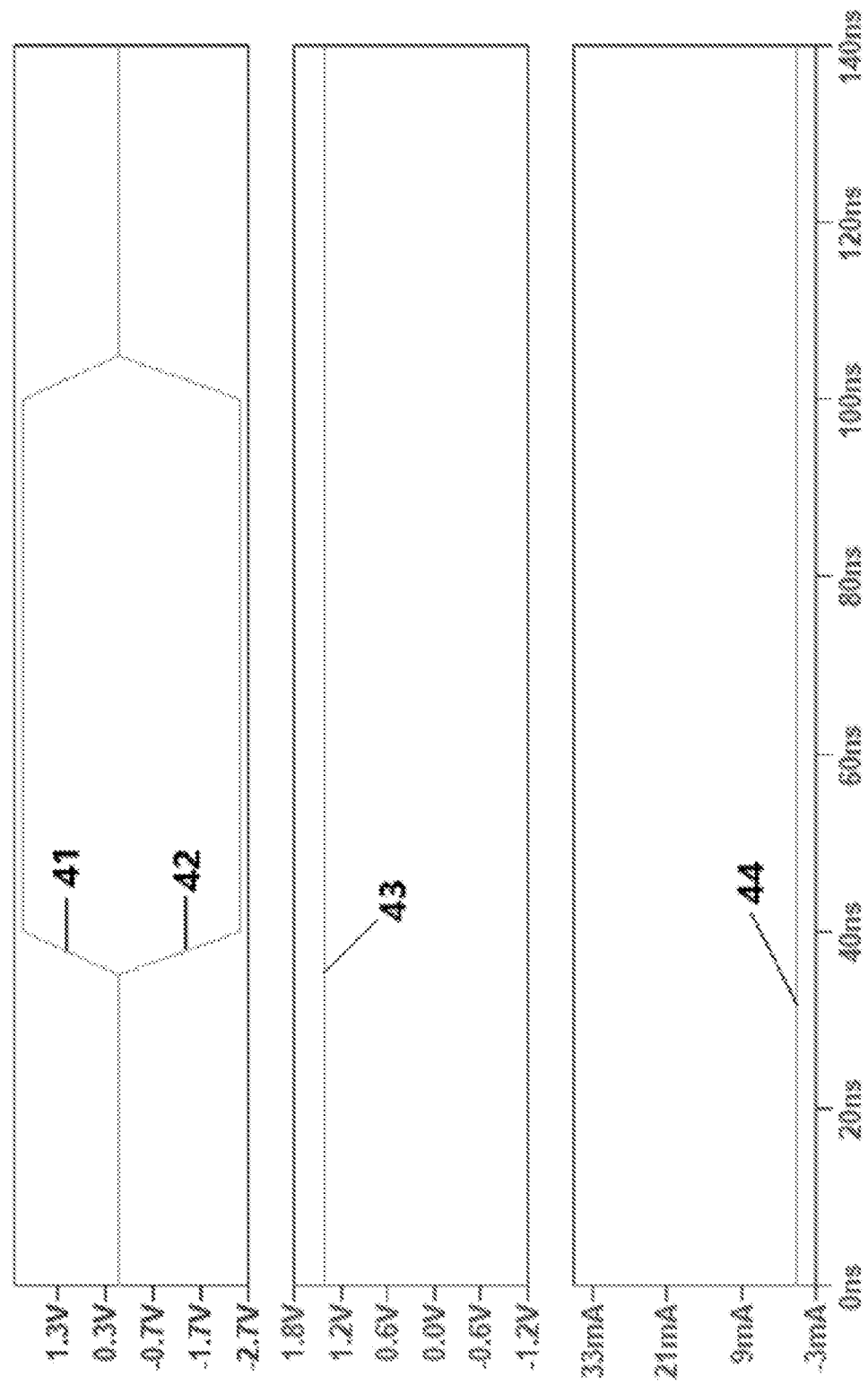

When an operation command is received, a read operation is immediately performed on the selected memory cell, that is, $V_{read}=4.5V$ is applied to the selected memory cell. For the selected memory cell in state 1, as shown in FIG. 4, the applied bitline voltage (see reference numeral 31 in FIG. 4) is 2.5V, and the applied wordline voltage (see reference numeral 32 in FIG. 4) is −2V. In this way, the voltage across the gate transistor device in the memory cell is greater than 4V. The gate transistor device is turned on to generate a read current (see reference numeral 34 in FIG. 4), and the capacitor voltage (see reference numeral 33 in FIG. 4) may change from −1V to 1.5V, that is, it is in state 0. For the selected memory cell in state 0, as shown in FIG. 5, the applied bitline voltage (see reference numeral 41 in FIG. 5) is 2.5V, and the applied wordline voltage (see reference numeral 42 in FIG. 5) is −2V. In this way, the voltage across the gate transistor device is less than 4V. The gate transistor is turned off, no read current is generated (see reference numeral 44 in FIG. 5), and the capacitor voltage (see reference numeral 43 in FIG. 5) is maintained at 1.4V. By monitoring whether there is a read current in the bitline, the state of the selected memory cell can be determined, and the data obtained after reading may be temporarily stored in the read buffer. After the read operation, the memory cell is in state 0.

Figure 6:
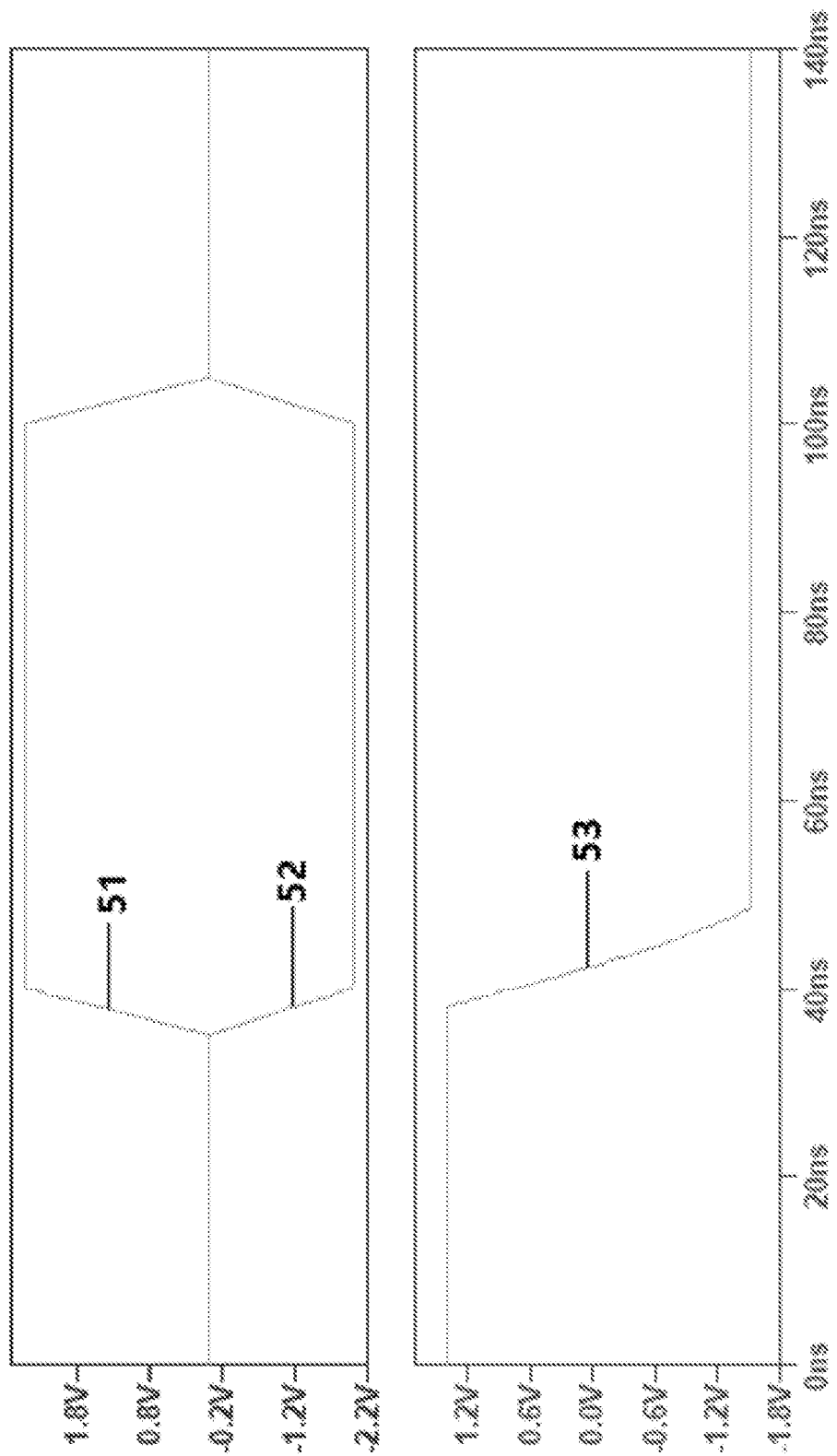
FIG. 6 is a graph of applying –4.5V write 1 voltage to the selected memory cell in state 0 provided by an embodiment of the disclosure.
Figure 7:
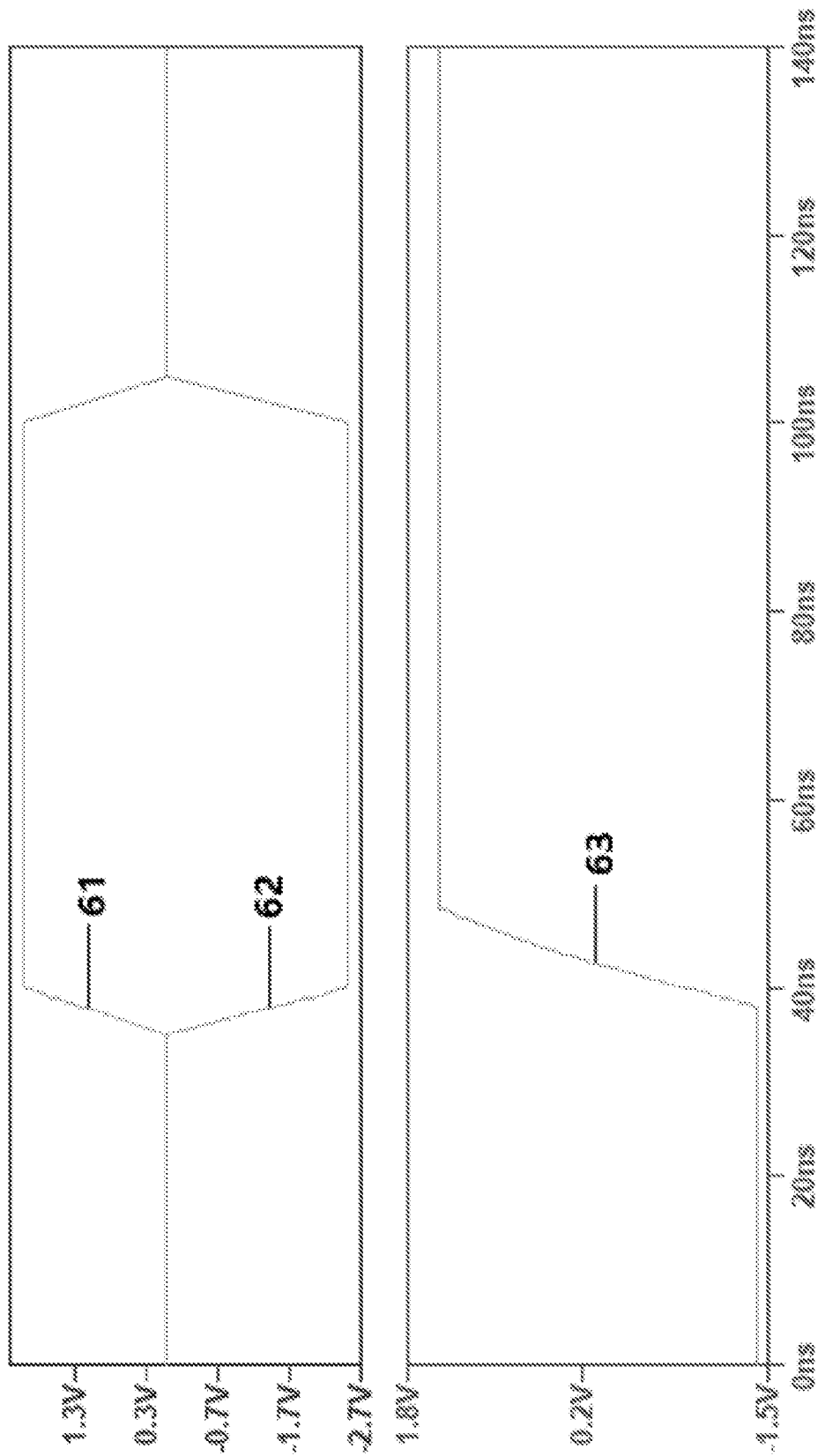
FIG. 7 is a graph of applying 4.5V write 0 voltage to the selected memory cell in state 1 provided by an embodiment of the disclosure.

If the type of the received operation command is a refresh operation, $V_{IN1}$=−4.5V is applied to the memory cell. As shown in FIG. 6, the applied bitline voltage (see reference numeral 52 in FIG. 6) is −2.5V, and the applied wordline voltage (see reference numeral 51 in FIG. 6) is 2V. Because the current memory cell is in state 0, the voltage across the gate transistor is greater than 4V, the gate transistor may be turned on, the capacitor voltage (see reference numeral 53 in FIG. 6) in the memory cell becomes −1.5V, and the writing of state 1 is completed. At this time, the state of the data in the read buffer is determined. If it is state 1, the operation ends, and if it is state 0, $V_{IN0}$=4.5V is applied to the memory cell. As shown in FIG. 7, the applied bitline voltage (see reference numeral 61 in FIG. 7) is −2.5V, and the applied wordline voltage (see reference numeral 62 in FIG. 7) is 2V. Because the current memory cell is in state 1, the voltage across the gate transistor is greater than 4V, the gate transistor may be turned on, the capacitor voltage (see reference numeral 63 in FIG. 7) in the memory cell becomes 1.5V, the writing of state 0 is completed, and the operation is ended.

If the received operation command is a read operation, the data temporarily stored in the read buffer is output to the I/O port, and then the refresh operation is performed to complete the write-back of the memory cell data.

If the received operation command is a write 1 operation, $V_{IN1}$=−4.5V is applied to the memory cell. As shown in FIG. 6, the applied bitline voltage (see reference numeral 52 in FIG. 6) is −2.5V, and the applied wordline voltage (see reference numeral 51 in FIG. 6) is 2V. Because the current memory cell is in state 0, the voltage across the gate transistor is greater than 4V, the gate transistor may be turned on, the capacitor voltage (see reference numeral 53 in FIG. 6) of the memory cell becomes −1.5V, and the writing of state 1 is completed.

If the received operation command is a write 0 operation, $V_{IN1}$=−4.5V is applied to the memory cell first. As shown in FIG. 6, the applied bitline voltage (see reference numeral 52 in FIG. 6) is −2.5V, and the applied wordline voltage (see reference numeral 51 in FIG. 6) is 2V. Because the current memory cell is in state 0, the voltage across the gate transistor is greater than 4V, the gate transistor may be turned on, the capacitor voltage 53 of the memory cell becomes −1.5V, and the writing of state 1 is completed. $V_{IN0}$=4.5V is applied to the memory cell next. As shown in FIG. 7, the applied bitline voltage (see reference numeral 61 in FIG. 7) is −2.5V, and the applied wordline voltage (see reference numeral 62 in FIG. 7) is 2V. Because the current memory cell is in state 1, the voltage across the gate transistor is greater than 4V, the gate transistor may be turned on, the capacitor voltage (see reference numeral 63 in FIG. 7) in the memory cell becomes 1.5V, the writing of state 0 is completed, and the operation is ended.

Figure 3:
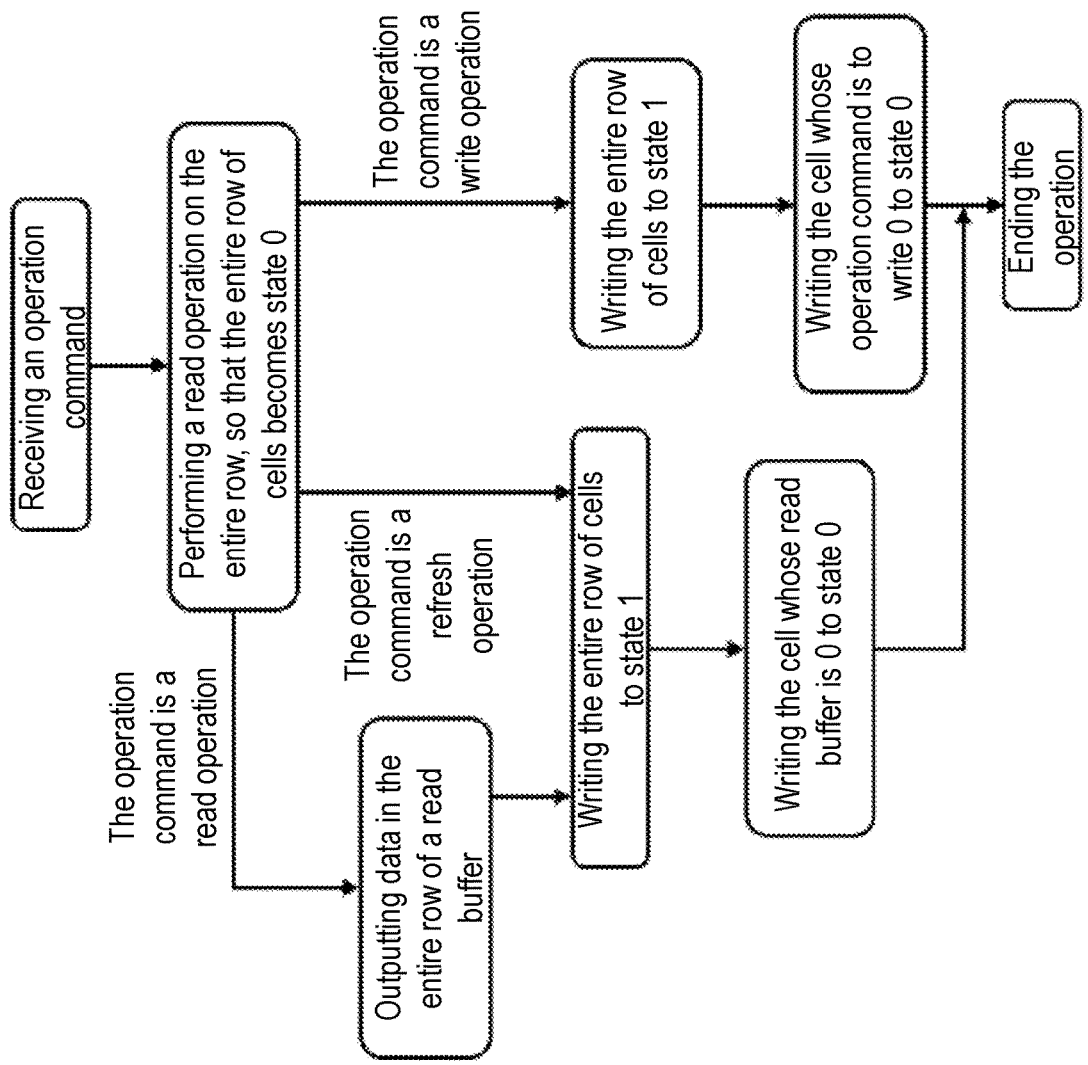

As shown in FIG. 3, a method for operating an entire row of a dynamic memory is provided.

When an operation command is received, $V_{read}$=4.5V is applied to the entire row of memory cells, that is, a voltage $V_{Wlread}$=−2V is applied to the wordline shared by the entire row of memory cells and a voltage $V_{BLread}$=2.5V is applied to the bitline connected to each memory cell. For the memory cell in state 1, as shown in FIG. 4, the voltage across the gate transistor is greater than 4V, the gate transistor is turned on, and a read current (see reference numeral 34 in FIG. 4) is generated, and the capacitor voltage (see reference numeral 33 in FIG. 4) becomes 1.5V, that is, it is in state 0. For the memory cell in state 0, as shown in FIG. 5, the voltage across the gate transistor is less than 4V, the gate transistor is turned off, no read current (see reference numeral 44 in FIG. 5) is generated, and the capacitor voltage (see reference numeral 43 in FIG. 5) remains stable. By monitoring whether there is a read current in the bitline, the state of the corresponding memory cell can be determined, and the data obtained after reading may be temporarily stored in the read buffer of the entire row. After the read operation, the entire row of memory cells is in state 0.

If the received operation command is a refresh operation, $V_{IN1}$=−4.5V is applied to the entire row of memory cells, as shown in FIG. 6. That is, a voltage $V_{WL1}$=2V is applied to the wordline shared by the entire row of memory cells and a voltage $V_{BL1}$=−2.5V is applied to the bitline connected to each memory cell. Because the entire row of memory cells is currently in state 0, so the voltage across the gate transistor is greater than 4V, and the gate transistor may be turned on, so that the entire row of memory cells is in state 1. It is then determined whether the temporarily stored data of each bit is state 1 or state 0 in the row read buffer, if the state is 1, the operation can be ended, and if the state is 0, $V_{IN0}$=4.5V is then applied to the corresponding memory cell, as shown in FIG. 7. That is, a voltage $V_{WL0}$=−2V is applied to the word line shared by the entire row of memory cells, and a voltage $V_{BL0}$=2.5V is applied to the bitline connected to the memory cells that need to be written to 0. When the voltage across the gate transistor of the corresponding memory cell is greater than 4V, the gate transistor may be turned on, and the writing of state 0 is completed.

If the received operation command is a write operation, $V_{IN1}$=−4.5V is applied to the entire row of memory cells, as shown in FIG. 6. That is, a voltage $V_{WL1}$=2V is applied to the wordline shared by the entire row of memory cells and a voltage $V_{BL1}$=−2.5V is applied to the bitline connected to each memory cell. Because the entire row of memory cells is currently in state 0, so the voltage across the gate transistor is greater than 4V, and the gate transistor may be turned on, so that the entire row of memory cells is in state 1. According to the operation command, which memory cells need to be written into state 0 is determined, and $V_{IN0}$=4.5V is applied to the corresponding memory cells, as shown in FIG. 7. That is, a voltage $V_{WL0}$=−2V is applied to the word line shared by the entire row of memory cells, and a voltage $V_{BL0}$=2.5V is applied to the bitline connected to the memory cells that need to be written to 0. When the voltage across the gate transistor of the corresponding memory cell is greater than 4V, the gate transistor may be turned on, and the writing of state 0 is completed.

Figure 8:
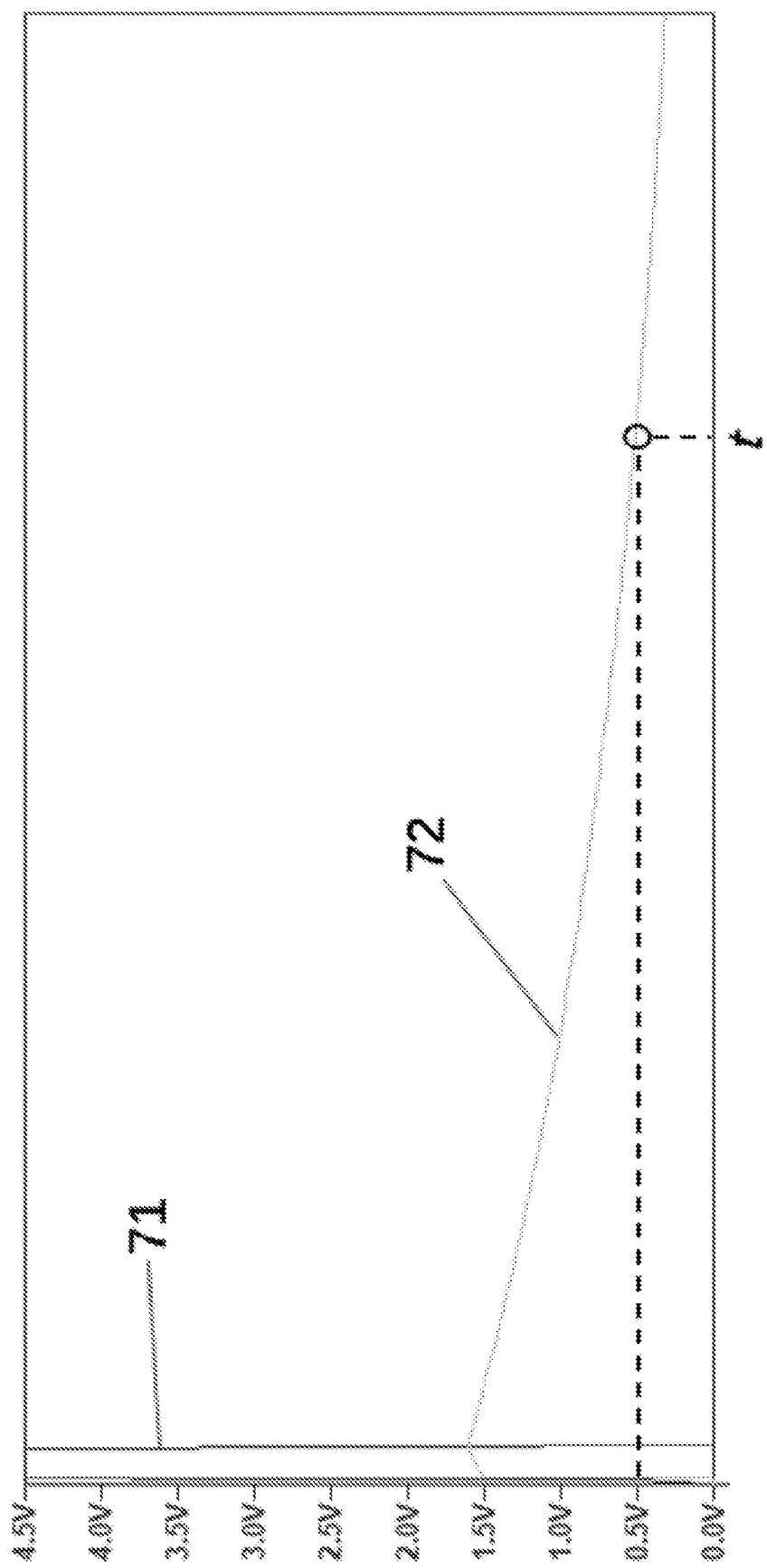
FIG. 8 is a voltage graph of a refresh operation for the selected memory cell in state 0 provided by an embodiment of the disclosure.

As shown in FIG. 8, a logic state "0" operation is performed on the memory cell, a write pulse $V_{IN0}$=4.5V is applied, and it can be seen that the capacitor voltage remains near 1.5V after the write is completed. Since then, due to the leakage phenomenon of the capacitor, the capacitor voltage gradually decreases from 1.5V over time and drops to 0.5V at time t, and the capacitor voltage corresponding to the logic state "0" is: 0.5V to 1.5V. If it continues to drop, the logic state stored in the memory cell may change from "0" to "1", that is, an error occurs in the stored data. Therefore, it is necessary to perform a refresh operation on the memory cell before the capacitor voltage drops to 0.5V to rewrite data. Therefore, it is necessary to refresh the data stored in the memory cell every interval time T. The interval time T is less than the time t required for the capacitor voltage to drop from the highest value to the lowest value due to the leakage of the capacitor in the memory cell, that is, it is less than the time t required for the voltage value of the capacitor in the memory cell to drop to the critical capacitor voltage value for the read operation to correctly read the state data of the memory cell during the write operation.

In the disclosure, even if leakage occurs in the capacitor in the selected memory cell, the normal operation of the read and write operations performed on this memory cell is effectively ensured A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A method for operating a dynamic memory, wherein the dynamic memory comprises wordlines and bitlines arranged vertically to each other and memory cells arranged in an array between the wordlines and the bitlines, each memory cell comprises a capacitor and a two-terminal gate device connected in series, the two-terminal gate device has bidirectional conduction characteristics and has a conduction threshold voltage $V_{TH}$ and a holding voltage $V_{hold}$, and the method comprises the following steps:
   (1) performing a refresh operation on the dynamic memory according to predetermined interval time T, receiving an operation command in real time at the same time, performing a read operation on a selected memory cell according to position information of the selected memory cell in the operation command when receiving the operation command, and temporarily storing state data read in the read operation, wherein the interval time T is less than time t required for a voltage value of the capacitor in the memory cell to drop to a critical capacitor voltage value for the read operation to correctly read the state data of the memory cell during a write operation;
   (2) performing a corresponding operation on the selected memory cell according to operation command type information in the operation command and outputting the temporarily stored data to a corresponding I/O port if a received operation command type is a read operation and then performing step (3), performing step (3) if the received operation command type is a refresh operation, or performing step (4) if the received operation command type is a write operation;
   (3) performing a write state 1 operation on the selected memory cell, determining the temporarily stored data of the selected memory cell next, and ending the operation if the temporarily stored data is in state 1 or performing a write state 0 operation on the selected memory cell if the temporarily stored data is in state 0; and
   (4) obtaining operation information of the write operation, and correspondingly performing the write state 1 operation or the write state 0 operation on the selected memory cell according to the obtained operation information of the write operation.

2. The method for operating the dynamic memory according to claim 1, wherein in step (1), the step of performing the read operation on the selected memory cell and temporarily storing the state data read in the read operation specifically comprises:
   (a) applying a bitline voltage $V_{BLread}$ on the bitline connected to the selected memory cell and applying a wordline voltage $V_{WLread}$ on the wordline connected to the selected memory cell to generate a read voltage of $V_{read}$ at both ends of the memory cell to be read, wherein the read voltage $V_{read}$ is configured to keep the two-terminal gate device in the selected memory cell in state 0 to be turned off and to turn on the two-terminal gate device in the selected memory cell in state 1 to change the selected memory cell from state 1 to state 0, and generates a read current;
   (b) detecting whether a read current is provided on the bitline connected to the selected memory cell and determining that the selected memory cell is in state 1 if a read current is provided and outputting a state 1 signal, otherwise determining that the selected memory cell is in state 0 if a read current is not provided and outputting a state 0 signal; and
   (c) sending the outputted state signal to a read buffer for temporary data storage.

3. The method for operating the dynamic memory according to claim 2, wherein in step (a), the read voltage $V_{read}$ satisfies the following relationships: $V_{read}-V_{C1}>V_{TH}$ and $V_{read}-V_{C0}<V_{TH}$, where $V_{C1}$ is the capacitor voltage when the memory cell is in state 1, and $V_{C0}$ is the capacitor voltage when the memory cell is in state 0.

4. The method for operating the dynamic memory according to claim 1, wherein performing the write state 1 operation on the selected memory cell is implemented by applying a voltage $V_{WL1}$ on the wordline connected to the selected memory cell and applying a voltage $V_{BL1}$ on the bitline connected to the selected memory cell to form a voltage difference of $V_{IN1}$ at both ends of the selected memory cell, and performing the write state 0 operation on the selected memory cell is implemented by applying a voltage $V_{WL0}$ on the wordline connected to the selected memory cell and applying a voltage $V_{BL0}$ on the bitline connected to the selected memory cell to form a voltage difference of $V_{IN0}$ at both ends of the selected memory cell, the voltage difference $V_{IN1}$ and the voltage difference $V_{IN0}$ satisfy the following relationships:

$$V_{IN1}=V_{BL1}-V_{WL1},\ V_{IN0}=V_{BL0}-V_{WL0}$$

$$|V_{IN1}|=|V_{IN0}|$$

$$V_{TH}<|V_{IN1}|I|V_{IN0}|<V_{TH}+V_{Hold}$$

$$||V_{IN1}|-V_{Hold}+|V_{BL1}||<V_{TH}$$

$$||V_{IN1}|-V_{Hold}+|V_{WL1}||<V_{TH}$$

$$||V_{IN1}|-V_{Hold}+|V_{BL0}||<V_{TH}$$

$$||V_{IN1}|-V_{Hold}+|V_{WL0}||<V_{TH}$$

$$||V_{IN1}|-V_{Hold}+|V_{BLread}||<V_{TH}$$

$$||V_{IN1}|-V_{Hold}+|V_{WLread}||<V_{TH}.$$

5. The method for operating the dynamic memory according to claim 4, wherein the interval time T is less than the time t required for the capacitor voltage in the memory cell to drop from $||V_{IN}|-V_{Hold}|$ to $V_{read}-V_{TH}$, and $V|_{IN}|=|V_{IN1}|=|V_{IN0}|$.

6. The method for operating the dynamic memory according to claim 1, wherein step (4) specifically comprises:
  directly performing the write state 1 operation on the selected memory cell when the operation information of the write operation is a write state 1; and performing the write state 1 operation on the selected memory cell first and performing the write state 0 operation on the selected memory cell next when the operation information of the write operation is a write state 0.

7. The method for operating the dynamic memory according to claim 1, wherein the position information of the selected memory cell in the operation command comprises bitwise, entire row, entire column, or matrix position information.

\* \* \* \* \*